US012684965B2

(12) United States Patent (10) Patent No.: US 12,684,965 B2
Wei et al. (45) Date of Patent: Jul. 14, 2026

(54) DISPLAY SUBSTRATE AND DISPLAY DEVICE

(71) Applicants:CHENGDU BOE OPTOELECTRONICS TECHNOLOGY CO., LTD., Chengdu (CN); BOE TECHNOLOGY GROUP CO., LTD., Beijing (CN)

(72) Inventors: Feng Wei, Beijing (CN); Hongjun Zhou, Beijing (CN); Lili Du, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 946 days.

(21) Appl. No.: 17/762,506

(22) PCT Filed: Mar. 22, 2021

(86) PCT No.: PCT/CN2021/082100
§ 371 (c)(1),
(2) Date: Mar. 22, 2022

(87) PCT Pub. No.: WO2022/198388
PCT Pub. Date: Sep. 29, 2022

(65) Prior Publication Data
US 2024/0057408 A1 Feb. 15, 2024

(51) Int. Cl.
*H10K 59/131* (2023.01)
*G09G 3/3225* (2016.01)

(52) U.S. Cl.
CPC ......... *H10K 59/131* (2023.02); *G09G 3/3225* (2013.01); *G09G 2300/0426* (2013.01);
(Continued)

(58) Field of Classification Search
CPC ............... H10K 59/131; G09G 3/3225; G09G 2300/0426; G09G 2310/0297;
(Continued)

(56) References Cited

U.S. PATENT DOCUMENTS 8,384,643 B2 2/2013 Hasegawa et al.
2005/0168416 A1* 8/2005 Hashimoto .......... G09G 3/3291
345/76
(Continued)

FOREIGN PATENT DOCUMENTS

CN 1648971 A 8/2005
CN 1975842 A * 6/2007 .......... G09G 3/2014
(Continued)

OTHER PUBLICATIONS

First Examination Report of counterpart UK application No. GB2215471.0 issued on Nov. 10, 2025.

*Primary Examiner* — Ricardo Osorio
(74) *Attorney, Agent, or Firm* — Lippes Mathias LLP

(57) ABSTRACT

Provided is a display substrate. In the display substrate, at least one data-select circuit group may control a data line lead to transmit a data signal to at least two data lines by time division in response to switch control signals supplied by at least two switch control lines at different time periods. A plurality of connecting portions that are electrically connected to a first power bus and a plurality of power lines may extend along the region between a plurality of the data-select circuit groups.

19 Claims, 16 Drawing Sheets

(52) U.S. Cl.
CPC .............. *G09G 2310/0297* (2013.01); *G09G 2320/0223* (2013.01); *G09G 2330/06* (2013.01)

(58) Field of Classification Search
CPC ....... G09G 2320/0223; G09G 2330/06; G09G 3/3275; H10D 10/821; H10D 64/511
See application file for complete search history.

(56) References Cited

U.S. PATENT DOCUMENTS

| | | | | |
|---|---|---|---|---|
| 2006/0123293 | A1* | 6/2006 | Kim | G09G 3/3291 |
| | | | | 714/724 |
| 2009/0303169 | A1* | 12/2009 | Tanikame | G09G 3/3208 |
| | | | | 345/100 |
| 2013/0140537 | A1 | 6/2013 | Ha et al. | |
| 2013/0155033 | A1* | 6/2013 | Jin | G09G 3/3266 |
| | | | | 345/204 |
| 2016/0293889 | A1* | 10/2016 | Nakamura | H10K 59/8731 |
| 2017/0358641 | A1* | 12/2017 | Park | H10K 59/1216 |
| 2018/0082630 | A1 | 3/2018 | Kim et al. | |
| 2020/0381458 | A1 | 12/2020 | Yang et al. | |
| 2023/0097811 | A1* | 3/2023 | Tao | G09G 3/006 |
| | | | | 345/55 |

FOREIGN PATENT DOCUMENTS

| | | | | | | |
|---|---|---|---|---|---|---|
| CN | 101599257 | A | | 12/2009 | | |
| CN | 102842283 | A | | 12/2012 | | |
| CN | 107038989 | A | | 8/2017 | | |
| CN | 107863059 | A | * | 3/2018 | .............. | G09F 9/30 |
| CN | 107871766 | A | | 4/2018 | | |
| CN | 110060621 | A | | 7/2019 | | |
| CN | 109102771 | B | * | 2/2022 | .............. | G09G 3/20 |
| CN | 114627758 | A | * | 6/2022 | | |
| EP | 4047589 | A1 | | 8/2022 | | |
| KR | 20170070905 | A | | 6/2017 | | |
| WO | 2022000240 | A1 | | 1/2022 | | |

* cited by examiner

DISPLAY SUBSTRATE AND DISPLAY DEVICE

CROSS-REFERENCE TO RELATED APPLICATION

This application is a 371 of PCT application No. PCT/CN2021/082100, filed on Mar. 22, 2021, the disclosure of which is incorporated herein by reference in its entirety.

TECHNICAL FIELD

The present disclosure relates to the field of display technologies, and in particular, relates to a display substrate and a display device.

BACKGROUND

Due to the advantages of lower power consumption, fast response and wide viewing angles, organic light-emitting diode (OLED) display diodes are widely applied in various display devices.

In the related art, an OLED display substrate generally includes a base substrate. The base substrate includes a display region and a non-display region, a plurality of pixels disposed in the display region, and a power line connected to the pixels and introduced into the display region via two sides of the non-display region. The power line is configured to provide the pixels a light-emitting drive signal to drive the pixels to emit light.

SUMMARY

Embodiments of the present discourse provide a display substrate and a display device. The technical solutions are as follows:

According to one aspect of the embodiments of the present disclosure, a display substrate is provided. The display substrate includes:

a base substrate, provided with a display region and a non-display region that are arranged along a first direction;

a plurality of sub-pixels in the display region;

a plurality of data lines in the display region, electrically connected to the plurality of sub-pixels, and configured to supply a data signal to the plurality of sub-pixels:

a plurality of power lines in the display region, electrically connected to the plurality of sub-pixels, and configured to supply a power signal to the plurality of sub-pixels;

a plurality of data line leads in the non-display region and electrically connected to the plurality of data lines;

a plurality of switch control lines in the non-display region;

a plurality of data-select circuit groups in the non-display region and spaced apart along a second direction, wherein at least one of the plurality of data-select circuit groups is configured to, in response to switch control signals supplied by at least two of the plurality of switch control lines at different time periods, control one of the plurality of data line leads to transmit the data signal to at least two of the plurality of data lines by time division, and the second direction is intersected with the first direction;

a first power bus in the non-display region and on a side, distal from the display region, of the plurality of data-select circuit groups; and a plurality of connecting portions, electrically connected to the first power bus and the plurality of power lines respectively, wherein the plurality of connecting portions extends along a region among the plurality of data-select circuit groups.

Optionally, the display substrate further includes:

a second power bus between the display region and the plurality of data-select circuit groups, and electrically connected to the plurality of connecting portions and the plurality of power lines;

wherein the second power bus and the connecting portion are on a same layer, the second power bus and the first power bus are on different layers, and the second power bus and the power line are on different layers.

Optionally, the first power bus is electrically connected to the connecting portion via a via hole, and the power line is electrically connected to the second power bus via a via hole.

Optionally, the display substrate further includes:

a third power bus on a side, distal from the display region, of the first power bus, and electrically connected to the first power bus;

wherein the third power bus is provided with at least one through hole and is configured to be in contact with a package material.

Optionally, a same number of connecting portions are between each two adjacent data-select circuit groups.

Optionally, one of the connecting portions is between each two adjacent data-select circuit groups.

Optionally, at least two of the data-select circuit groups are electrically connected to a same data line lead.

Optionally, each three adjacent data-select circuit groups are electrically connected to a same data line lead.

Optionally, the display substrate includes: six switch control lines, extending along the second direction, and electrically connected to the three adjacent data-select circuit groups that share a same data line lead.

Optionally, each of the data-select circuit groups includes two gates, one source and two drains:

wherein the two gates are electrically connected to two of the switch control lines, the two drains are electrically connected to two of the data lines, and the one source is electrically connected to one of the data line leads.

Optionally, the plurality of data line leads include a first data line lead and a second data line lead;

wherein the first data line lead is electrically connected to the second data line lead, the second data line lead is electrically connected to the data line, and the second data line lead the and the first data line lead are on different layers.

Optionally, the first data line lead is overlapped with the first power bus and the switch control line, and the second data line lead is overlapped with two of the connecting portions.

Optionally, the plurality of data line leads further include a third data line lead:

wherein the third data line lead is electrically connected to the data line and the data-select circuit group.

Optionally, the third data line lead is overlapped with the second power bus in the display substrate.

Optionally, in the display substrate, the first data line lead and the switch control line are on different layers, the first data line lead and the first power bus are on different layers, the second data line lead and the connecting portion are on different layers, and the third data line lead and the second power bus are on different layers.

Optionally, the first power bus, the switch control line, the data line, the power line, and a second data line lead and a third data line lead in the plurality of data line leads are all on a same layer as a first metal layer of the display substrate; and the first data line lead in the plurality of data line leads, the connecting portion, and a second power bus and a third power bus in the display substrate are all on a same layer as a second metal layer of the display substrate.

Optionally, the first metal layer is a source-drain metal layer in the display substrate, and the second metal layer is a gate metal layer in the display substrate.

Optionally, the display substrate further includes at least one electrostatic discharge circuit, wherein each of the at least one electrostatic discharge circuit is electrically connected to a first drive signal line, a second drive signal line, and one data line lead.

Optionally, each of the at least one electrostatic discharge circuit is between two adjacent connecting portions; and the first drive signal line, the electrostatic discharge circuit and the second drive signal line are between the first power bus and the switch control line and are sequentially arranged along the first direction.

According to another aspect of the embodiments of the present disclosure, a display device is provided. The display device includes the display substrate as described in the foregoing aspect.

BRIEF DESCRIPTION OF THE DRAWINGS

For clearer descriptions of the technical solutions in the embodiments of the present disclosure, the following briefly introduces the accompanying drawings required for describing the embodiments. It is obvious that the accompanying drawings in the following description show merely some embodiments of the present disclosure, and persons of ordinary skill in the art may still derive other drawings from these accompanying drawings without creative efforts.

DETAILED DESCRIPTION

In order to make the objects, technical solutions and advantages of the present disclosure clearer, the present disclosure will be described in detail below with reference to the accompanying drawings.

The power line in the related art has rather great impedance due to the arrangement manner, which eventually causes the display substrate to have a poor display effect.

Figure 1:
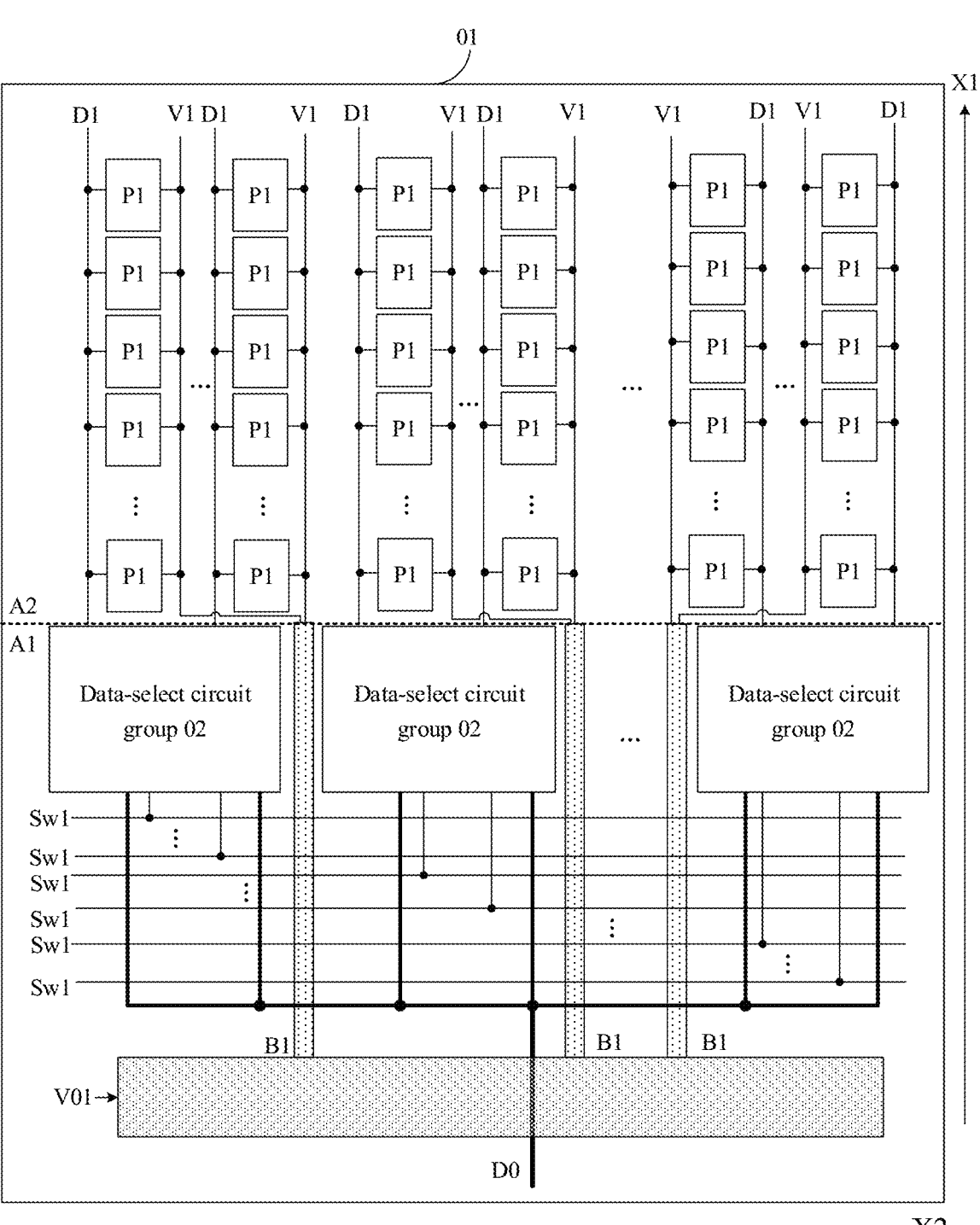
FIG. 1 is a schematic structural diagram of a display substrate according to an embodiment of the present disclosure.

FIG. 1 is a schematic structural diagram of a display substrate according to an embodiment of the present disclosure. As shown in FIG. 1, the display substrate may include a base substrate 01, a plurality of sub-pixels P1, a plurality of data lines D1, a plurality of power lines V1, a plurality of data line leads D0, a plurality of switch control lines Sw1, and a plurality of data-select circuit groups 02.

The base substrate 01 may be provided with a non-display region A1 and a display region A2 that are arranged along a first direction X1.

The plurality of sub-pixels P1 may be disposed in the display region A2.

The plurality of data lines D1 may be disposed in the display region A2, electrically connected to the plurality of sub-pixels P1, and configured to supply a data signal to the plurality of sub-pixels P1.

The plurality of power lines V1 may be disposed in the display region A2, electrically connected to the plurality of sub-pixels P1, and configured to supply a power signal to the plurality of sub-pixels P1.

The plurality of data line leads D0 may be disposed in the non-display region A1, and electrically connected to the plurality of data lines D1. The plurality of data line leads D0 may also be electrically connected to a data signal terminal, and the plurality of data line leads D0 may transmit the data signal supplied by the data signal terminal to the plurality of data lines D1 as connected electrically. Then, the plurality of data lines D1 may supply the data signal as received to the plurality of sub-pixels P1.

The plurality of switch control lines Sw1 may be disposed in the non-display region A1.

The plurality of data-select circuit groups 02 may be disposed in the non-display region A1 and may be spaced apart along the second direction X2. At least one data-select circuit group 02 of the plurality of data-select circuit groups 02 may be configured to, in response to switch control signals supplied by at least two switch control lines Sw1 of the plurality of switch control lines Sw1 at different time periods, control one data line lead D0 among the plurality of data line leads D0 to transmit the data signal to at least two data lines D1 of the plurality of data lines D1 by time division. That is, the at least one data-select circuit group 02 may be electrically connected to at least two switch control lines Sw1 and at least two data lines D1, and the number of switch control lines Sw1 and the number of data lines D1 as electrically connected may be the same. The second direction X2 may be intersected with the first direction X1. For example, referring to FIG. 1, the second direction X2 and the first direction X1 may be perpendicular to each other.

For example, in the case that at least two switch control lines Sw1 supply switch control signals with a valid potential, at least one data-select circuit group 02 may control one of the data line leads D0 as connected to establish an electrical connection with at least two data lines D1. In the case that the at least two switch control lines Sw1 supply switch control signals with an invalid potential, the at least one data-select circuit group 02 may control the one data line lead D0 as connected to break the electrical connection with the at least two data lines D1. In the case that the at least two data lines D1 are in electrical connection with the one data line lead D0, the one data line lead D0 may transmit a data signal to the at least two data lines D1 by time division. Then, the at least two data lines D1 may then transmit the data signal as received to the sub-pixels P1, so as to drive the sub-pixels P1 to emit light.

Based on the function of at least one data-select circuit group 02, it can be determined that the potential of the switch control signal supplied by each switch control line Sw1 can be flexibly configured, such that the data-select circuit group 02 which is connected to the identical data line lead D0 can, under the control of different switch control lines Sw1, independently and reliably transmit the data signal transmitted by the one data line lead D0 as connected to the sub-pixels P1 in different columns via different data lines D1, thereby achieving the purpose of data signal selection.

In addition, the data-select circuit group 02 may be configured to share the data line lead D0, which can reduce the number of signal lines to be disposed in the non-display region A1, and also help to narrow the non-display region A1. Assuming that the non-display region A1 is disposed on the lower bezel of the display substrate, then the lower bezel can also be narrowed, which namely facilitates the narrow bezel design.

Further referring to FIG. 1, the display substrate may further include a first power bus V01 and a plurality of connecting portions B1. The first power bus V01 may be disposed in the non-display region A1 and may be disposed on a side, distal from the display region A2, of the plurality of data-select circuit groups 02. The plurality of connecting portions B1 may be electrically connected to the first power bus V01 and the plurality of power lines V1 respectively, and may extend along a region among the plurality of data-select circuit groups 02. That is, as shown in FIG. 1, the plurality of connecting portions B1 may be arranged alternately with the plurality of data-select circuit groups 02. In other words, at least one connecting portion B1 may extend to the display region A2 by passing through the area between two adjacent data-select circuit groups 02 and may be electrically connected to the power line V1.

In some embodiments, the first power bus V01 may also be electrically connected to a power terminal capable of supplying the power signal, and may transmit the power signal supplied by the power terminal to the plurality of connecting portions B1 as connected electrically. Then, the plurality of connecting portions B1 transmits the power signal as received to the plurality of power lines V1 as connected electrically. Further, the plurality of power lines V1 may supply the power signal to the plurality of sub-pixels P1 as connected electrically. In other words, the first power bus V01, one first connecting portion B1, and one power line V1 that are electrically connected may form a signal line supplying the power signal to a column of sub-pixels P1.

In combination with the configuration of the data-select circuit group 02, in the embodiments of the present disclosure, the spacing between each two adjacent data-select circuit groups 02 may be flexibly adjusted and the channel breadth length ratio of each data-select circuit group 02 may be flexibly designed to effectively increase the spacing between each two adjacent data-select circuit groups 02. Provided that the spacing between each two adjacent data-select circuit groups 02 is increased, the width of the connecting portion B1 between each two adjacent data-select circuit groups 02 may be widened, such that the purpose of reducing the impedance on the signal line supplying the power signal can be achieved.

Optionally, the power line V1 may be a direct-current power line for supplying a light-emitting drive signal to the sub-pixel P1. That is, the signal line as formed by electrically connecting the first power bus V01, one first connecting portion B1 and one power line V1 may be a direct-current signal line supplying the light-emitting drive signal to a column of sub-pixels P1.

For example, assuming that the display substrate is an OLED display substrate, each sub-pixel P1 may then include a pixel circuit and a light-emitting element. The pixel circuit may be electrically connected to the data line D1, the power line V1 and the light-emitting element, and the pixel circuit may drive the light-emitting element to emit light under the control of the data signal supplied by the data line D1 and the power signal supplied by the power line V1.

After testing, a stable power signal is a necessary condition for the light-emitting element to emit light normally and effectively, and the greater the impedance on the power line, the poorer the stability of the power signal as finally outputted by the power line. Based on the principle that the narrower the signal line the greater the impedance on the signal line, the width of the power line V1 for supplying the power signal in the related art is rather narrow, which may cause the power line V1 to have a great impedance and thereby cause the power signal transmitted to the sub-pixels P1 from the power line V1 to have a poor stability. As a result, the display substrate may be prone to poor light emission phenomena, such as emitting light unevenly and poor display effect. Based on the analysis of FIG. 1, and compared with the related art, the width of the signal line supplying the power signal in the display substrate according to embodiments of the present disclosure can be appropriately widened. Accordingly, the impedance on the power line V1 can be reduced. As a result, the stability of the power signal transmitted from the power line V1 to the sub-pixels P1 can be high, which ensures that the light-emitting element emits light normally and effectively.

In summary, embodiments of the present disclosure provide a display substrate, and in the display substrate, at least one data-select circuit group may control the data line lead to transmit the data signal to at least two data lines by time division in response to the switch control signals supplied by at least two switch control lines at different time periods. A plurality of connecting portions that is electrically connected to the first power bus and the plurality of power lines may extend along a region between the plurality of the data-select circuit groups. As a result, it is possible to increase the spacing between any two adjacent data-select circuit groups by flexibly adjusting the position of each data-select circuit group, which helps to widen the width of each connecting portion. Since the connecting portion is electrically connected to the power line supplying the power signal to a sub-pixel, it is possible to reduce the impedance on the signal line supplying the power signal and thereby improve the display effect.

Optionally, in embodiments of the present disclosure, a same number of connecting portions B1 may be disposed between each two adjacent data-select circuit groups 02. For example, referring to the display substrate shown in FIG. 1, one connecting portion B1 may be disposed between each two adjacent data-select circuit groups 02 as shown in FIG. 1.

By supplying a same number of connecting portions B1 between each two adjacent data-select circuit groups 02, it is possible to facilitate wiring and save the wiring cost. By disposing one connecting portion B1 between each two adjacent data-select circuit groups 02, it can further help to effectively widen the width of the connecting portion B1 between each two adjacent data-select circuit groups 02, which namely helps to further widen the width of the signal line supplying the power signal.

Optionally, since the plurality of power lines V1 is electrically connected to the plural columns of sub-pixels P1 in one-to-one correspondence, the number of the power lines V1 shall be greater than or equal to the column number of the sub-pixels P1 in the display substrate. Since it is unnecessary to connect the plurality of connecting portions B1 to the sub-pixels P1, the number of the plurality of connecting portions B1 may be relatively small. That is, referring to FIG. 1, in embodiments of the present disclosure, the number of the plurality of connecting portions B1 may be smaller than the number of the plurality of power lines V1.

Optionally, referring to FIG. 1, at least two data-select circuit groups 02 may be electrically connected to the same data line lead D0, and may namely share the same data line lead D0. Further, among the plurality of data-select circuit groups 02 as electrically connected to the same data line lead D0, each two data-select circuit groups 02 may be adjacent.

The number of signal lines to be disposed in the non-display region A1 can be further reduced by configuring at least two data-select circuit groups 02 to share the same data line lead D0, which can further help to narrow the lower bezel. In addition, the wiring can be further simplified by configuring the adjacent data-select circuit groups 02 to share the same data line lead D0.

Optionally, the number of switch control lines Sw1 electrically connected to each data-select circuit group 02 may be the same, which means that the number of data lines D1 as electrically connected may be the same. Moreover, at least two data lines D1 as electrically connected to each data-select circuit group 02 may be adjacent to each other. That is, at least two data lines D1 electrically connected to each data-select circuit group 02 may be electrically connected to two adjacent columns of sub-pixels P1. The wiring can be simplified by configuring the number of data lines D1 as electrically connected to each data-select circuit group 02 to be the same and configuring the respectively data lines D1 to be adjacent.

Figure 2:
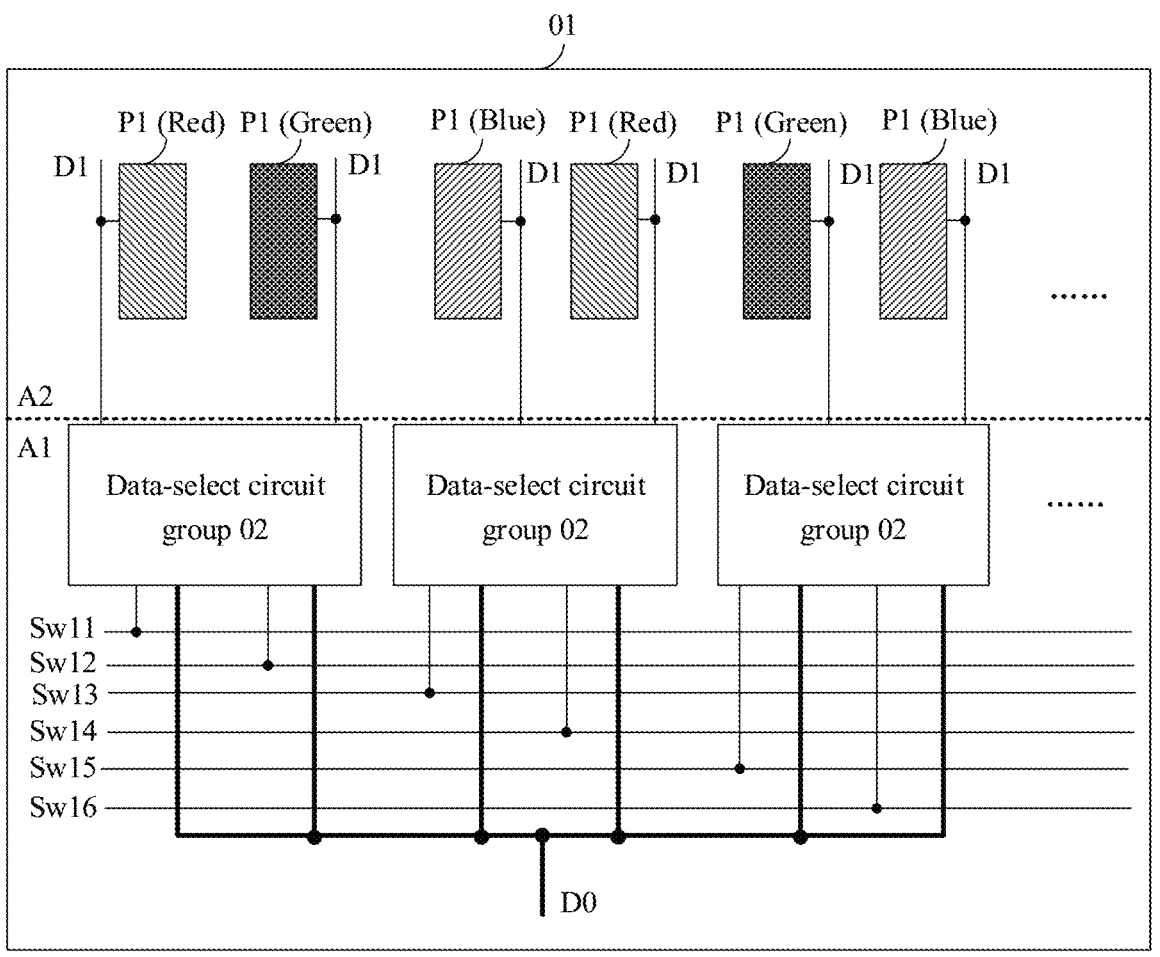
FIG. 2 is a schematic structural diagram of another display substrate according to an embodiment of the present disclosure.

For example, a reference is made to FIG. 2 that is a schematic structural diagram of another display substrate. In the display substrate as shown in FIG. 2, each three adjacent data-select circuit groups 02 may be electrically connected to one data line lead D0. Moreover, each data-select circuit group 02 is electrically connected to two switch control lines Sw1 and two data lines D1. That is, each data-select circuit group 02 may include two gates, one source, and two drains (not shown in the figures). The two gates may be electrically connected to two switch control lines Sw1, the two drains may be electrically connected to two data lines D1, and the one source may be electrically connected to one data line lead D0.

Figure 3:
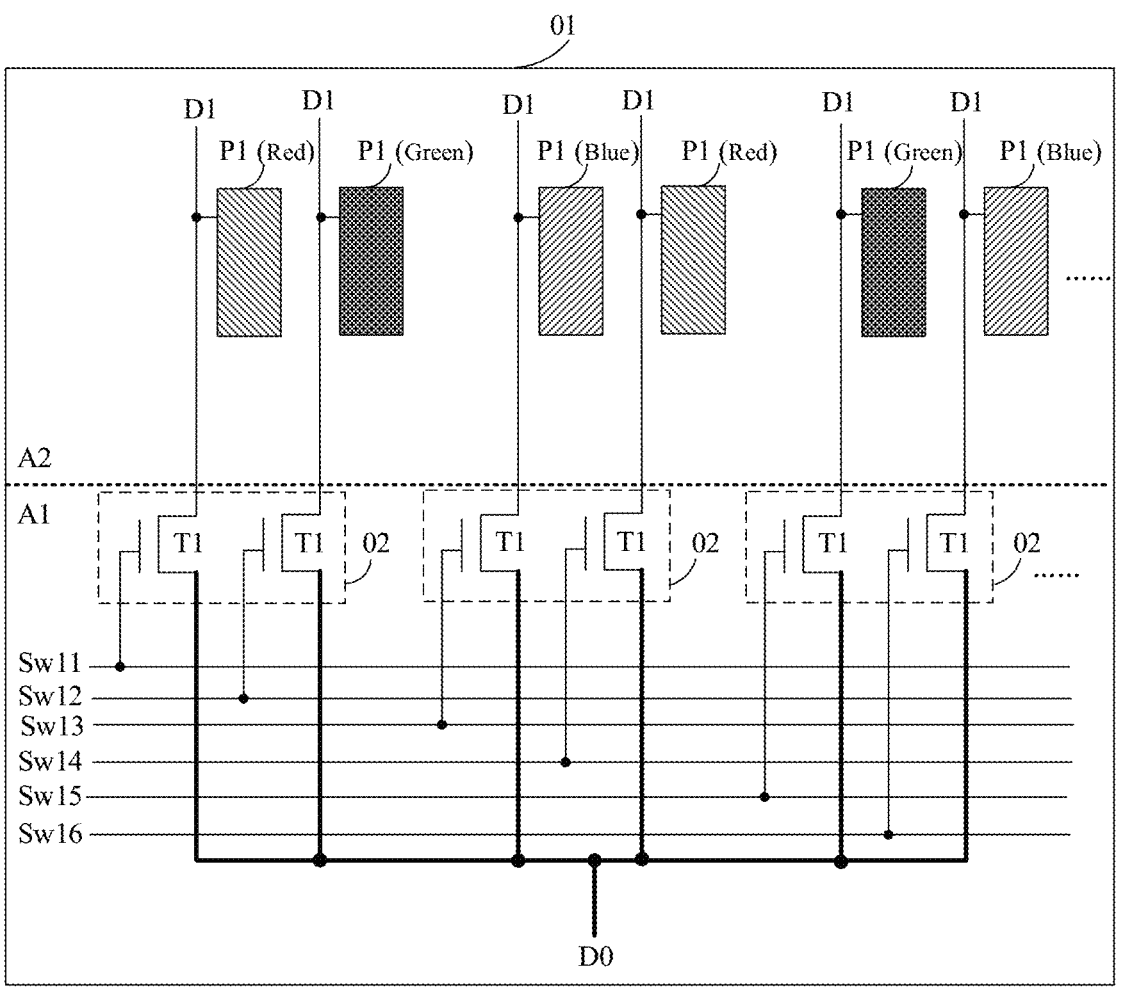
FIG. 3 is a schematic structural diagram of still another display substrate according to an embodiment of the present disclosure.

Optionally, taking the structure shown in FIG. 2 as an example, FIG. 3 shows an optional structure of the data-select circuit group 02. As shown in FIG. 3, in the three data-select circuit groups 02 that share the same data line lead D0, each data-select circuit group may include two switch transistors T1. The gates of the two switch transistors T1 may each be electrically connected to one switch control line Sw1, the sources of the two switch transistors T1 may both be electrically connected to the data line lead D0, and the drains of the two switch transistors T1 may each be electrically connected to one data line D1.

In combination with the structure shown in FIG. 2 and FIG. 3, the number of switch control lines Sw1 in the display substrate may be the sum of the number of switch control lines Sw1 electrically connected to each data-select circuit group 02 among the data-select circuit groups 02 sharing the same data line lead D0. For example, for the structure shown in FIGS. 2 and 3, the display substrate, in combination with FIG. 1, totally includes six switch control lines Sw1 extending along the second direction X2.

That is, for the structure shown in FIG. 2 and FIG. 3, the ratio of the data-select circuit group 02 to the data line lead D0 is 1:3, and the ratio of the switch transistor T1 to the data line lead D0 is 1:6. In other words, for the structure shown in FIGS. 2 and 3, the data-select circuit group 02 electrically connected to the same data line lead D0 is divided into three groups, and each group is configured to include two switch transistors T1. As a result, the connecting portion B1 may pass longitudinally between each two adjacent data-select circuit groups 02 conveniently.

It should be noted that a column of sub-pixels P1 is represented in FIGS. 2 and 3 with merely one sub-pixel P1. FIGS. 2 and 3 show only one data line lead D0 and three data-select circuit groups 02 that share the data line lead D0. In addition, in order to illustrate that the six switch transistors T1 in the three data-select circuit groups 02 are electrically connected to different switch control lines, the six switch control lines are represented in FIGS. 2 and 3 with SW11 to SW16. The following accompanying drawings are similar to FIGS. 2 and 3.

Optionally, in embodiments of the present disclosure, each three adjacent sub-pixels P1 in the same row have different colors, and each sub-pixel P1 in the same column may have the same color.

For example, referring to FIGS. 2 and 3, the colors of the adjacent three sub-pixels P1 in the same row as shown are red (R), green (G), and blue (B), respectively.

Optionally, in combination with the structures shown in FIGS. 1 to 3, the spacing between each two adjacent data-select circuit groups 02 may be greater than a spacing threshold. For example, the spacing threshold may be about a few hundred microns. As a result, the connecting portion B1 may be disposed conveniently between each two adjacent data-select circuit groups 02, and the width of the connecting portion B1 can be widened, which thereby reduces the impedance on the signal line supplying the power signal.

Figure 4:
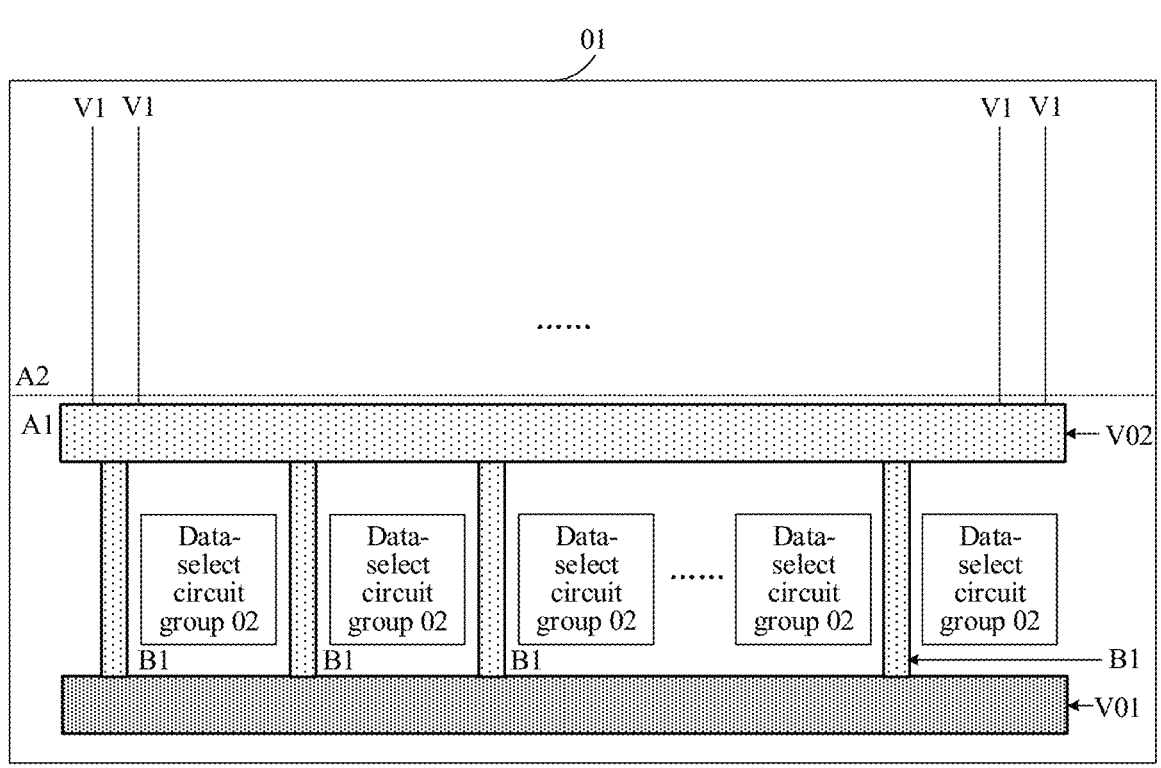
FIG. 4 is a schematic structural diagram of yet another display substrate according to an embodiment of the present disclosure.

Optionally, FIG. 4 is a schematic structural diagram of yet another display substrate according to an embodiment of the present disclosure. As shown in FIG. 4, the display substrate may include a second power bus V02.

The second power bus V02 may be disposed in the non-display region A1 and may be disposed between the display region A2 and the plurality of data-select circuit groups 02. The second power bus V02 may be electrically connected to a plurality of connecting portions B1 and a plurality of power lines V1. As a result, the plurality of connecting portions B1 may firstly transmit the power signal as received to the second power bus V02, and then the second power bus V02 transmits the power signal to the power line V1. That is, the second power bus V02 also belongs to a part of the signal line supplying the power signal.

Optionally, in embodiments of the present disclosure, the second power bus V02 and the plurality of connecting portions B1 may be disposed on a same layer, the second power bus V02 and the first power bus V01 may be disposed on different layers, and the second power bus V02 and the power line V1 may be disposed on different layers.

Figure 5:
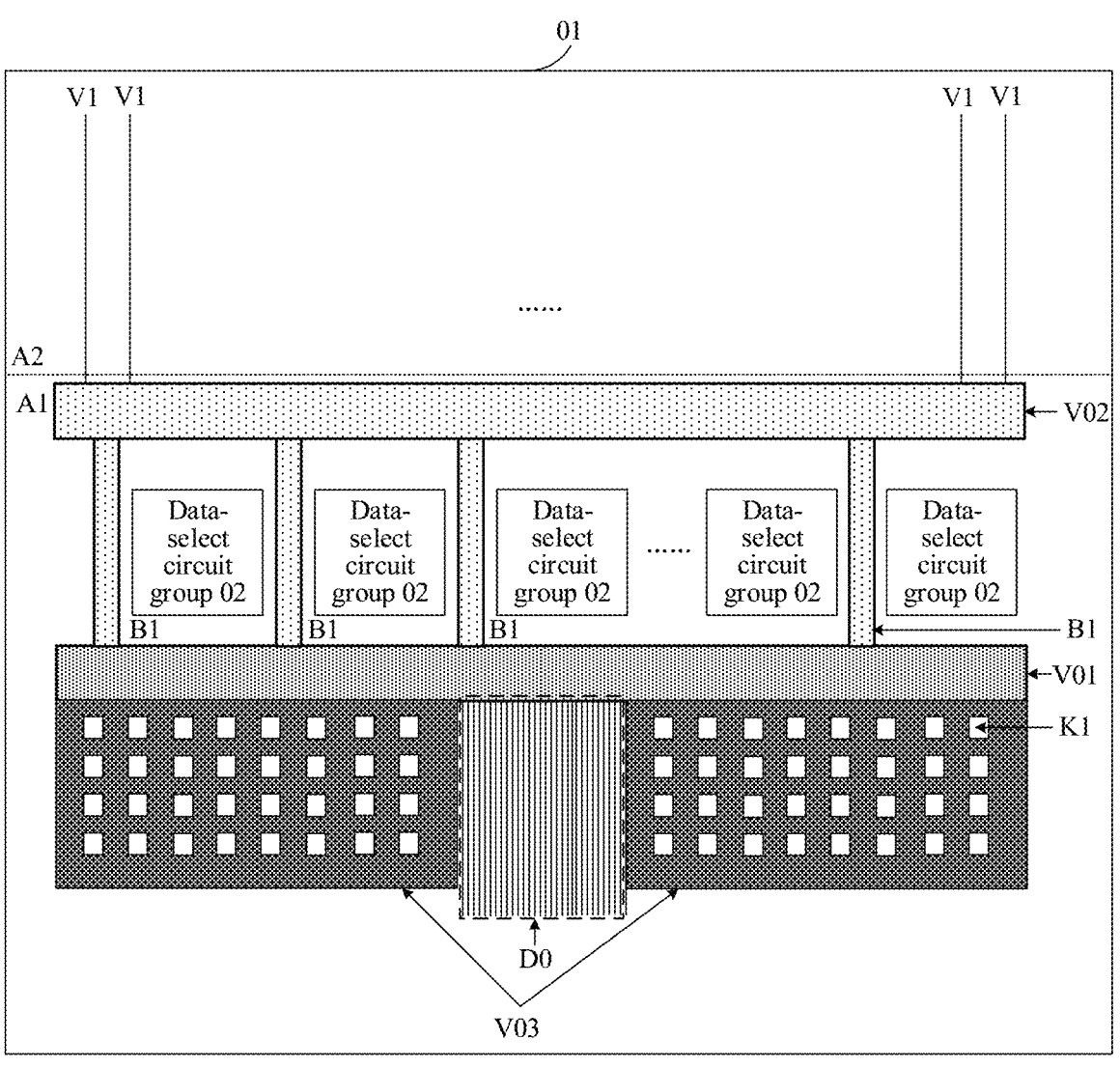
FIG. 5 is a schematic structural diagram of yet another display substrate according to an embodiment of the present disclosure.

Optionally, FIG. 5 is a schematic structural diagram of yet another display substrate according to an embodiment of the present disclosure. As shown in FIG. 5, the display substrate may include a third power bus V03.

The third power bus V03 may be disposed on a side, distal from the display region A2, of the first power bus V01 and may be electrically connected to the first power bus V01. Thus, the third power bus V03 may be disposed to be electrically connected to the power terminal. The third power bus V03 may firstly receive the power signal transmitted from the power terminal, and then transmit to the sub-pixel P1 via the first power bus V01, the connecting portion B1, the second power bus V02, and the power line V1. That is, the third power bus V03 also belongs to a part of the signal line supplying the power signal.

Referring to FIG. 5, in embodiments of the present disclosure, the third power bus V03 may be provided with at least one through hole K1, and may be configured to be in contact with the package material. In addition, FIG. 5 further shows an ensemble of data line leads D0 that are disposed on a side, distal from the connecting portion B1, of the first power bus V01. That is, the data line lead D0 may be electrically connected to the data-select circuit group 02 by extending from the location shown in FIG. 5 to the data-select circuit group 02.

It should be noted that the impedance on the signal line supplying the power signal can be further reduced by configuring the signal line supplying the power signal to meet the structure shown in FIG. 5, which thereby improves the transmission stability of the power signal. Moreover, the uniformity and transmission efficiency of the power signal can be improved, such that the problem of poor display as caused by the poor stability and uniformity of the power signal transmitted to sub-pixel P1 can finally be effectively solved.

Figure 6:
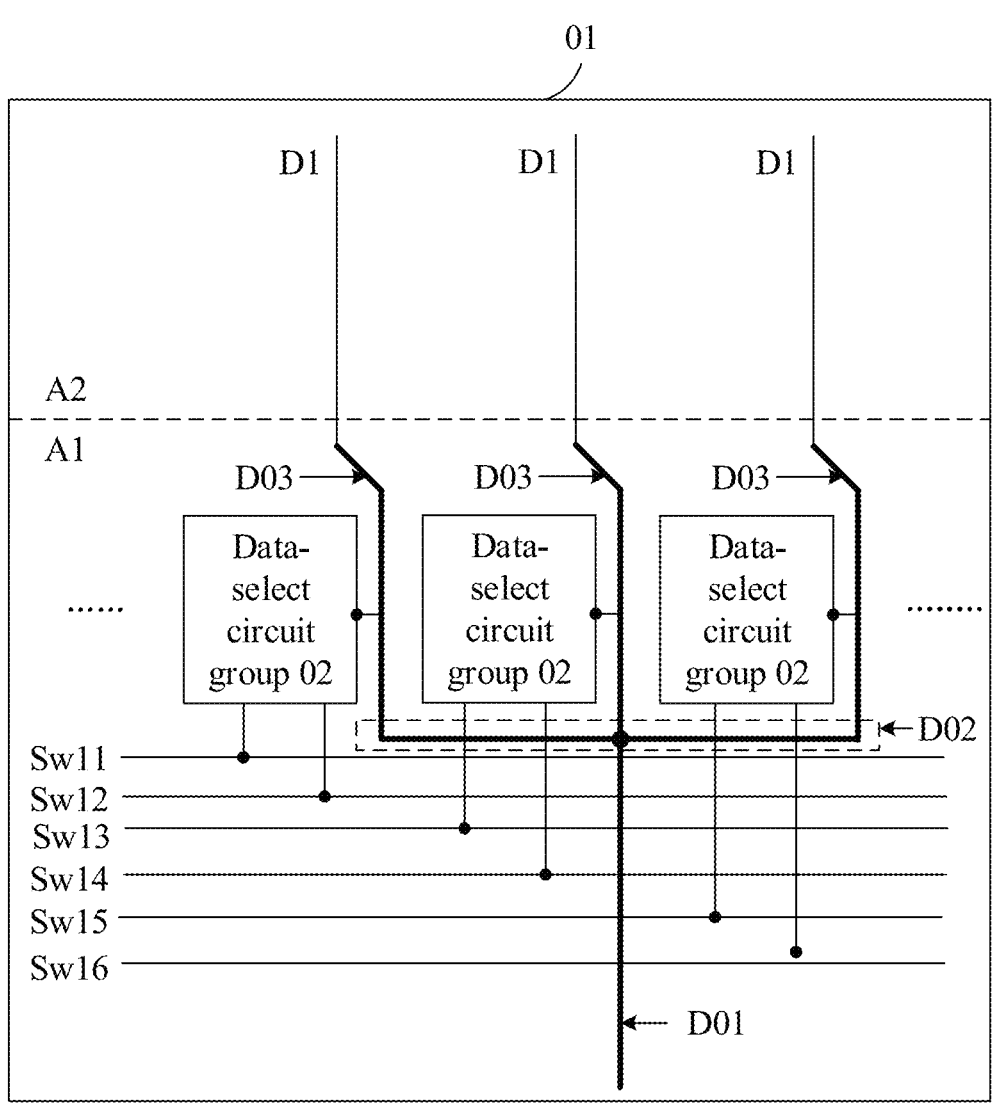
FIG. 6 is a schematic structural diagram of yet another display substrate according to an embodiment of the present disclosure.

Optionally, FIG. 6 is a schematic structural diagram of yet another display substrate according to an embodiment of the present disclosure. As shown in FIG. 6, the data line lead D0 may include a first data line lead D01, a second data line lead D02, and a third data line lead D03.

The first data line lead D01 may be electrically connected to the second data line lead D02, and the second data line lead D02 may be electrically connected to the data line D1. The third data line lead D03 may be electrically connected to the data line D1 and the data-select circuit group 02. That is, the second data line lead D02 may be electrically connected to the data line D1 via the third data line lead D03.

Optionally, in combination with FIGS. 5 and 6, the third data line lead D03 may overlap with the second power bus V02 in embodiments of the present disclosure. The first data line lead D0 and the switch control line Sw1 may be disposed on different layers, the first data line lead D01 and the first power bus V01 may be disposed on different layers, the second data line lead D02 and the connecting portion B1 may be disposed on different layers, and the third data line lead D03 and the second power bus V02 may be disposed on different layers. The problem of signal crosstalk can be avoided by configuring the two overlapped portions to be disposed on different layers.

Figure 7:
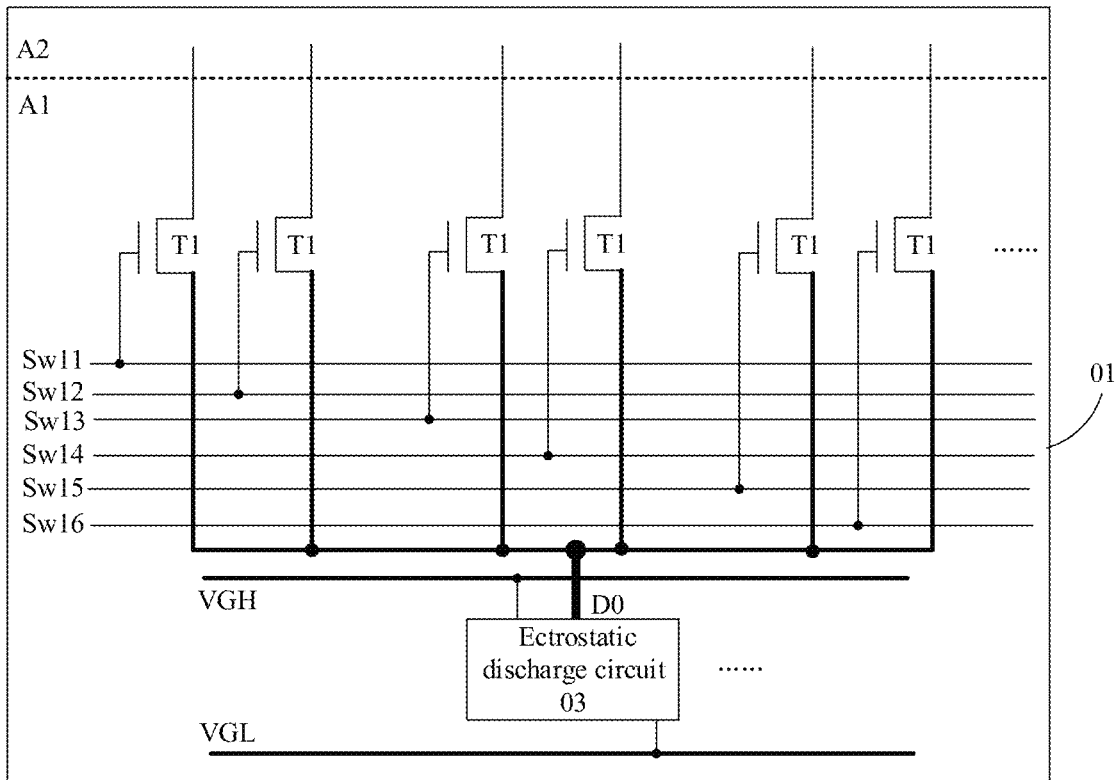
FIG. 7 is a schematic structural diagram of yet another display substrate according to an embodiment of the present disclosure.

Optionally, FIG. 7 is a schematic structural diagram of yet another display substrate according to an embodiment of the present disclosure. As shown in FIG. 7, the display substrate may further include at least one electro-static discharge (ESD) circuit 03.

Each electrostatic discharge circuit 03 may be electrically connected to a first drive signal line VGH, a second drive signal line VGL, and a data line lead D0 (i.e., the first data line lead D01). The electrostatic discharge circuit 03 may be configured to electrostatically discharge the data signal transmitted on the data line lead D0, so as to further ensure the display yield of the display substrate.

For example, when static electricity appears on the data line lead D0, the static discharge circuit 03 may conduct away the positive static electricity appearing on the data line lead D0 via the first drive signal line VGH, and may conduct away the negative static electricity appearing on the data line lead D0 via the second drive signal line VGL.

Optionally, in combination with FIG. 5 and FIG. 7, each electrostatic discharge circuit 03 may be disposed between two adjacent connecting portions B1. The first drive signal line VGH, the electrostatic discharge circuit 03 and the second drive signal line VGL may be disposed between the first power bus V01 and the switch control line Sw1, and may be arranged sequentially along the first direction X1.

Figure 8:
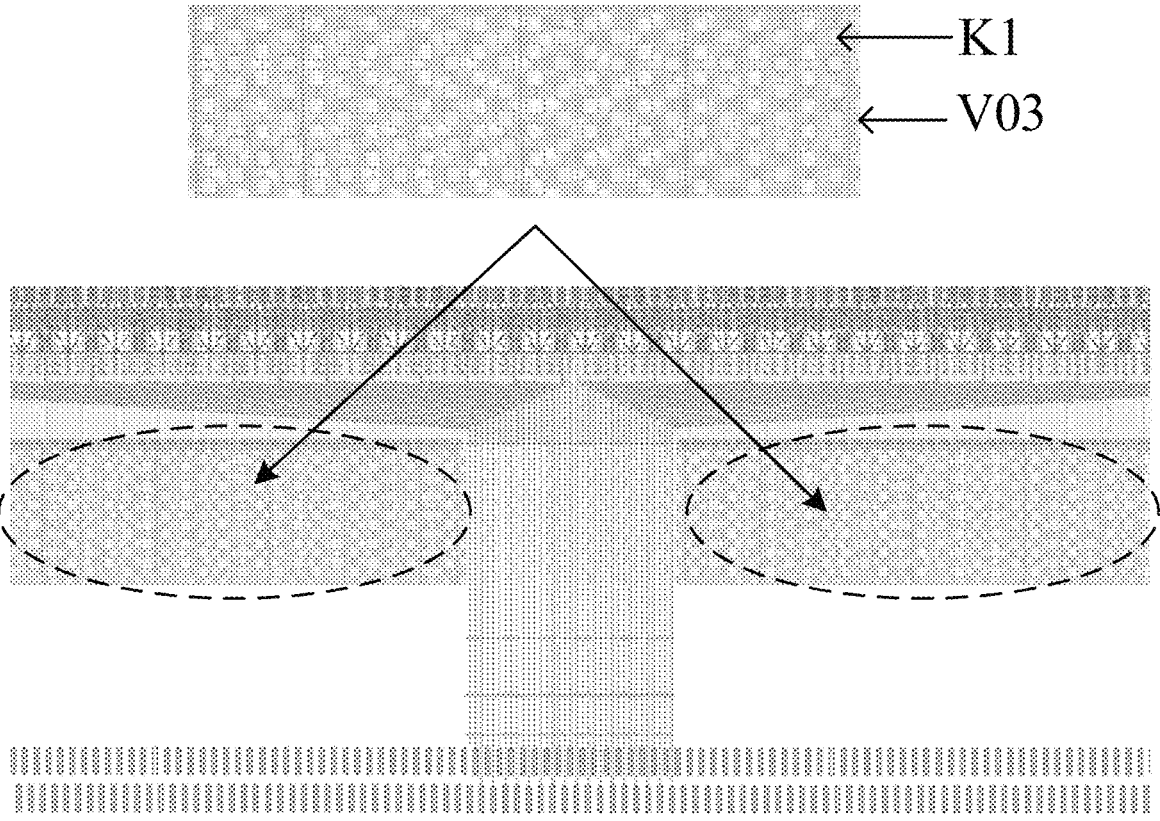
FIG. 8 is a structural layout of a display substrate according to an embodiment of the present disclosure.

Optionally, taking the display substrate shown in FIGS. 5 to 7 as an example, FIG. 8 shows a structural layout of the display substrate including the third power bus V0 and an enlarged view of the area where the third power bus V03 is disposed. In combination with FIG. 5 and FIG. 8, a plurality of through holes K1 is disposed in the region where the third power bus V03 is disposed, and the third power bus V03 is in contact with the package material.

Figure 9:
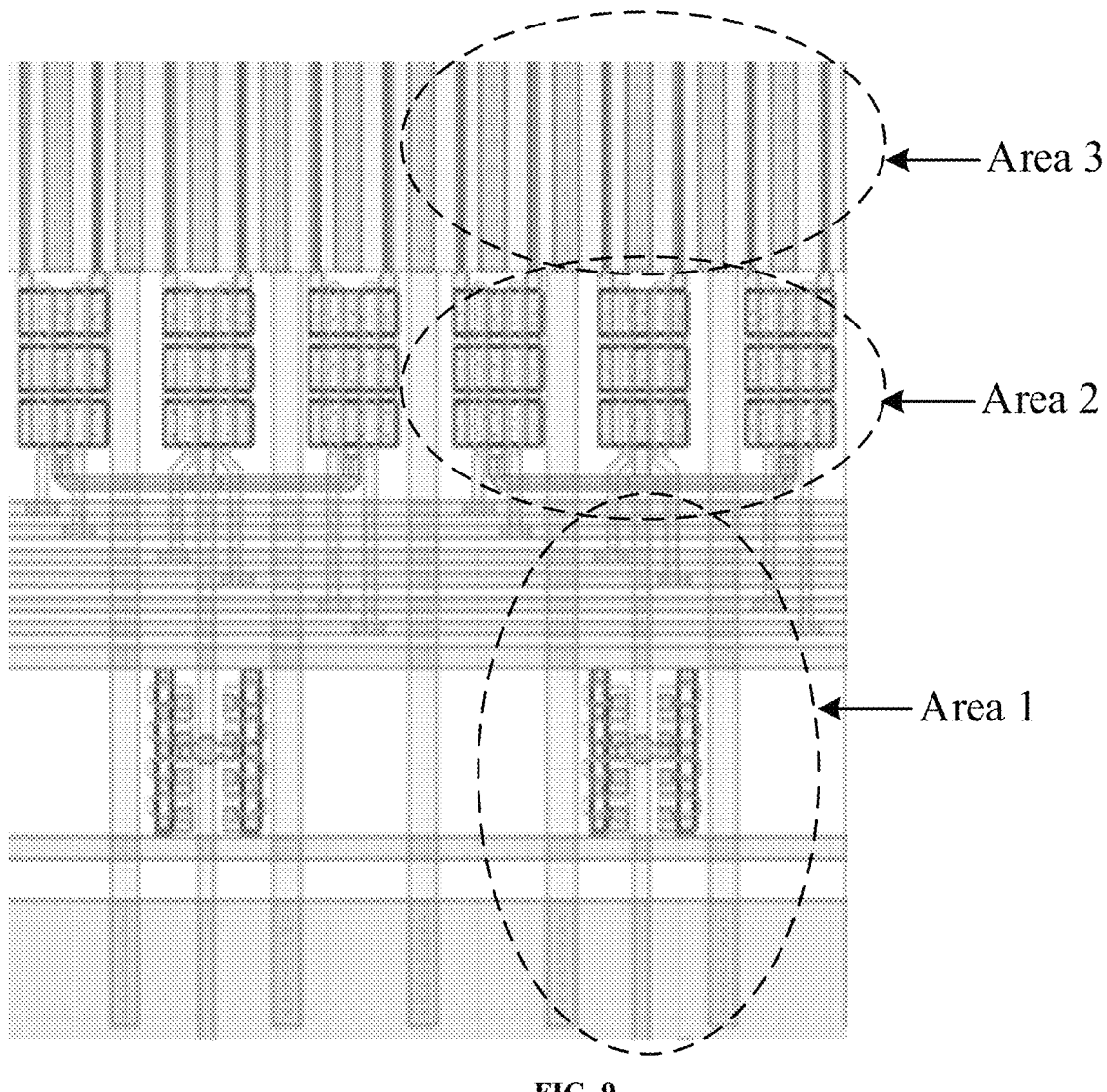
FIG. 9 is a structural layout of another display substrate according to an embodiment of the present disclosure.
Figure 10:
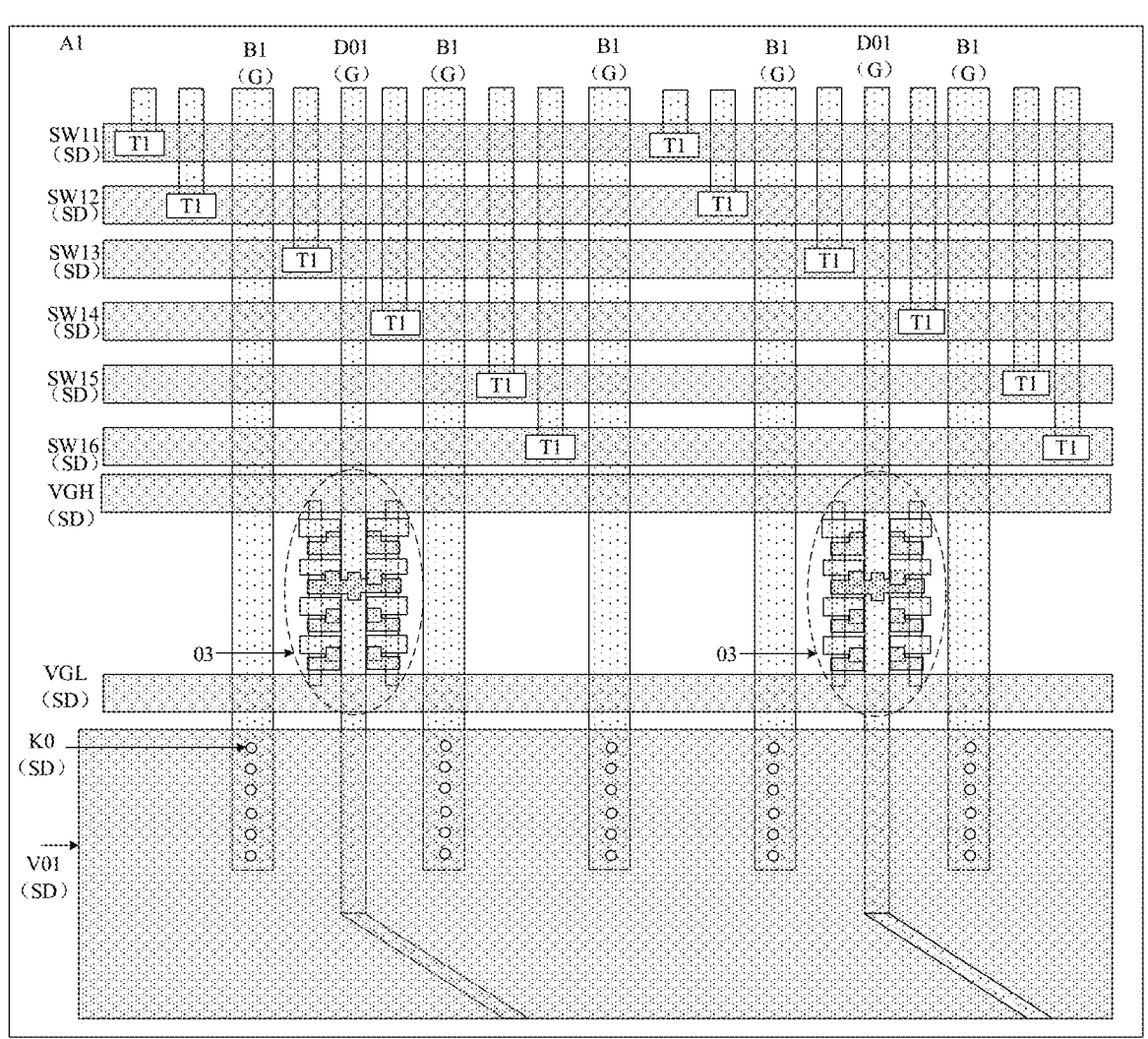
FIG. 10 is an enlarged partial view of the layout shown in FIG. 9.
Figure 11:
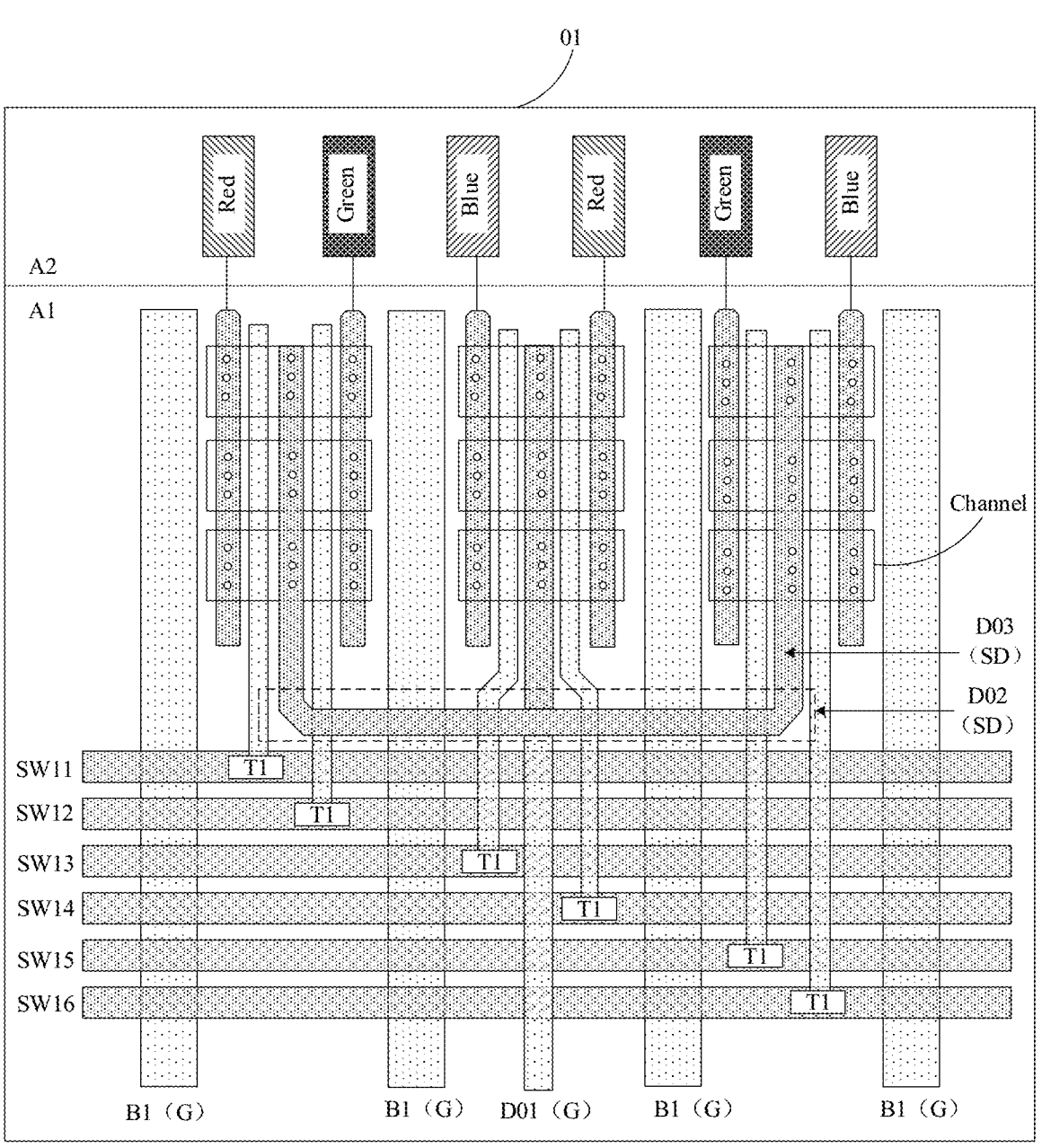
FIG. 11 is an enlarged partial view of the layout shown in FIG. 9.
Figure 12:
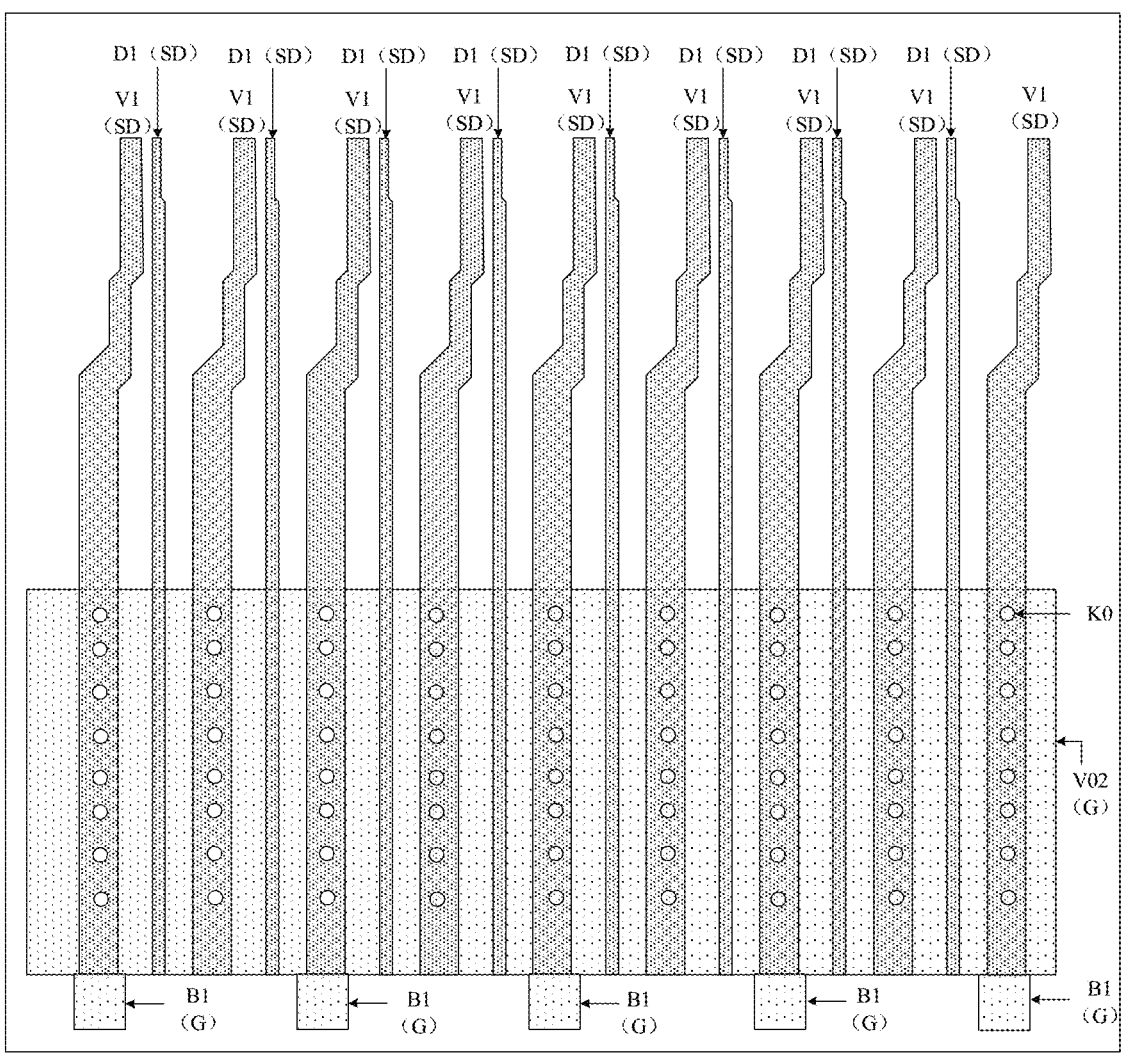
FIG. 12 is an enlarged partial view of the layout shown in FIG. 9.
Figure 13:
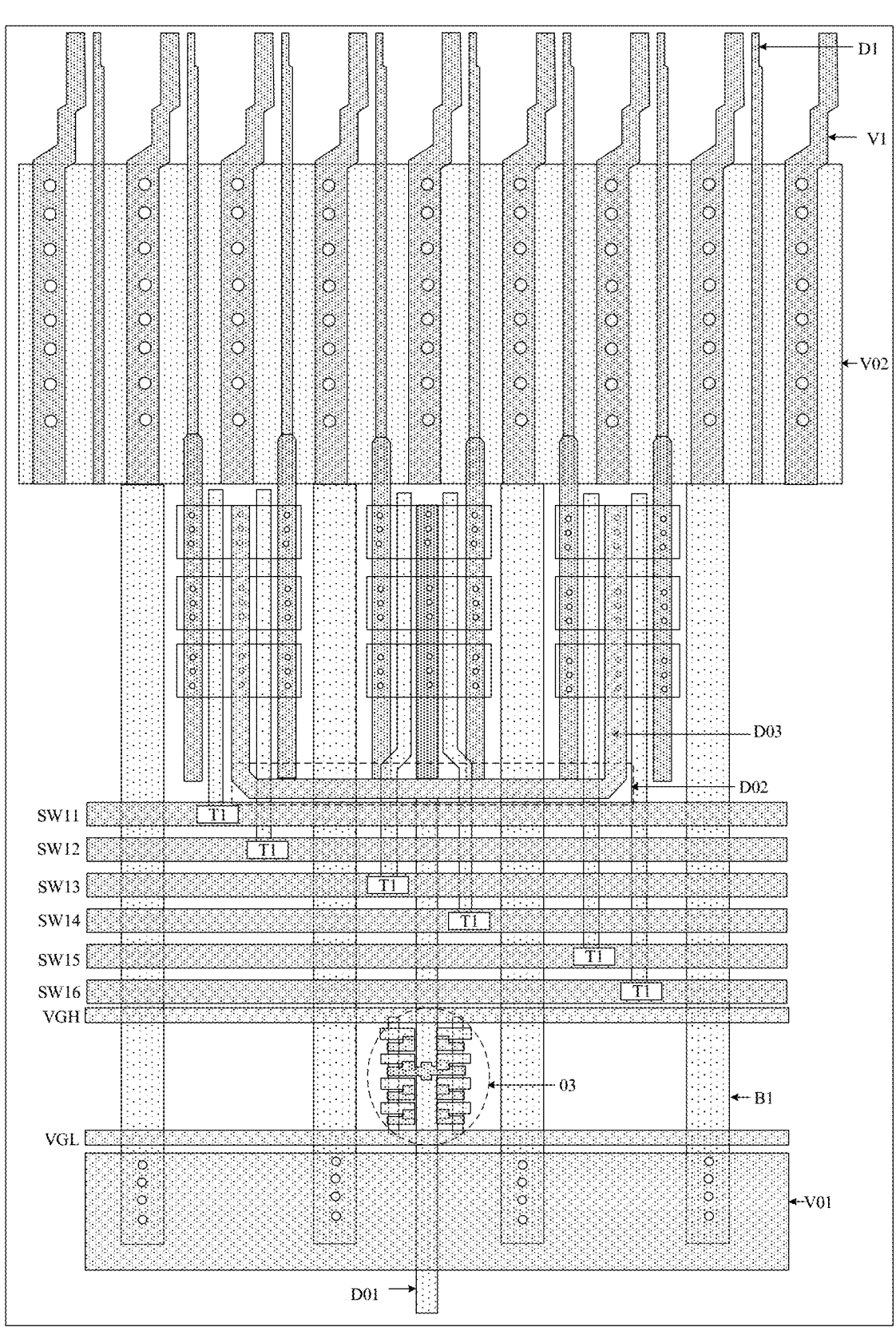
FIG. 13 is an enlarged partial view of the layout shown in FIG. 9.

Optionally, taking the display substrate shown in FIGS. 5 to 7 as an example, FIG. 9 shows a structural layout of a display substrate not including the third power bus V03. FIG. 10 shows an enlarged view of the area 1 in the layout shown in FIG. 9, FIG. 11 shows an enlarged view of the area 2 in the layout shown in FIG. 9, and FIG. 12 shows an enlarged view of the area 3 in the layout shown in FIG. 9. FIG. 13 shows an overall enlarged view of the area 1, area 2, and area 3.

In combination with FIGS. 9 to 13, the first power bus V01, the switch control line Sw1, the first drive signal line VGH, the second drive signal line VGL, the second data line lead D02, the third data line lead D03, the data line D1, and the power line V1 in embodiments of the present disclosure may all be disposed on the same layer as the first metal layer of the display substrate. For example, the first metal layer may be a source-drain metal layer shown in FIGS. 9 to 13.

Optionally, in embodiments of the present disclosure, the first data line lead D0, the connecting portion B1, the second power bus V02, and the third power bus V03 may all be disposed on the same layer as the second metal layer of the display substrate. For example, the second metal layer 04 may be the gate metal layer shown in FIGS. 9 to 13.

Optionally, the two portions, which are disposed on different layers and electrically connected to each other, of the display substrate as disclosed in embodiments of the present disclosure may be electrically connected to each other via the via hole. For example, referring to FIG. 10 and FIG. 12, the connecting portion B1 may be electrically connected to the first power bus V01 via the via hole K0, and the power line V1 may be electrically connected to the second power bus V02 via the via hole K0.

For example, assuming that the first power bus V01 and the source-drain metal layer SD are disposed on the same layer, and the connecting portion B1 and the gate metal layer G are disposed on the same layer, the via hole K0 passing through the source-drain metal layer SD and the gate metal layer G may be disposed in advance, and the connecting portion B1 is electrically connected reliably to the first power bus V01 via the via hole K0. The power supply line V1 and the second power supply bus V02 may be disposed in the similar fashion, which is not described herein any further.

Since the gate metal layer G and source-drain metal layer SD are essential components for forming the sub-pixel P1, the manufacturing process can be further simplified and manufacturing cost can be saved by configuring the aforesaid signal lines and structures to be disposed on the same layer as the gate metal layer G or source-drain metal layer SD. Moreover, the signal interference between the two overlapped portions can be avoided, which further ensures the display effect and the yield of the display substrate.

Figure 14:
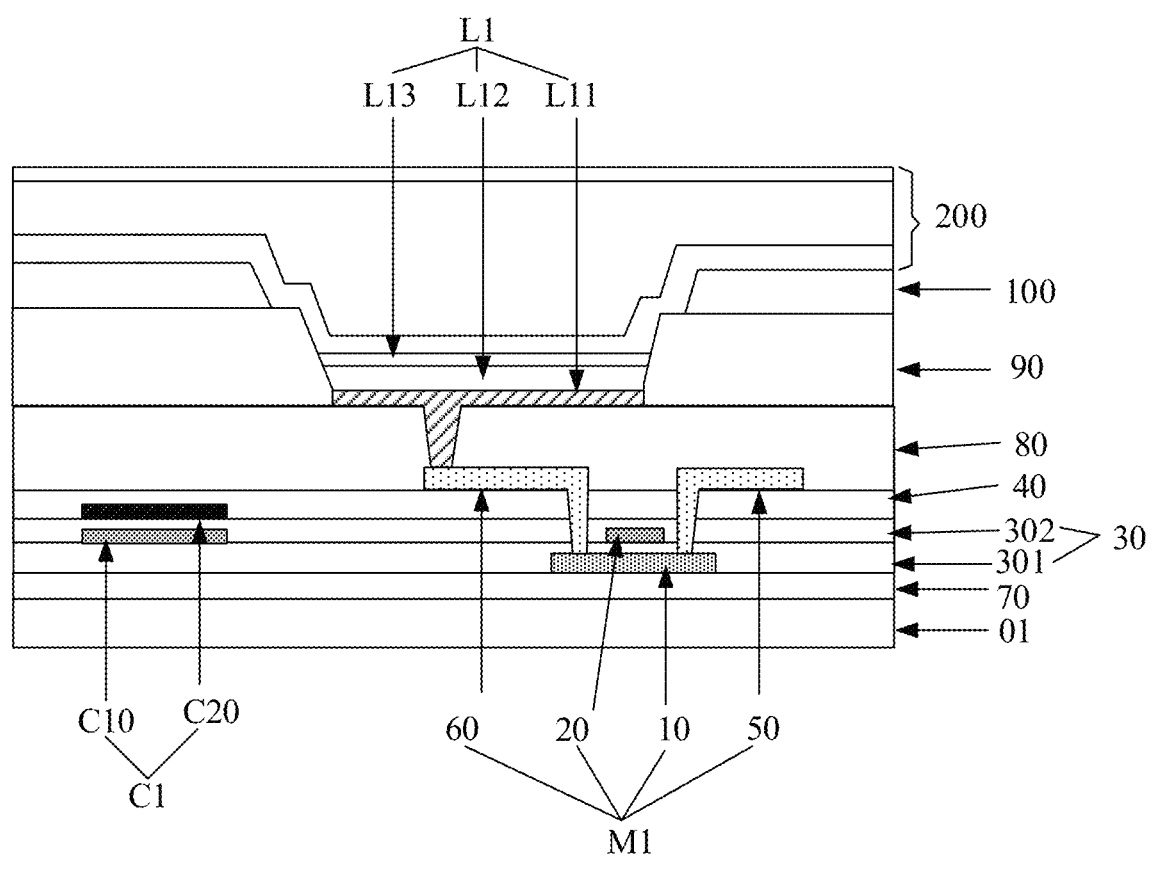
FIG. 14 is a schematic structural diagram of a sub-pixel according to an embodiment of the present disclosure.

For example, a reference is made to FIG. 14 that is a schematic structural diagram of a pixel circuit. At least one sub-pixel P1 (e.g., each sub-pixel P1) of the plurality of sub-pixels P1 may include a driving thin-film transistor M1, a storage capacitor C1, and a light-emitting diode L1.

Optionally, the driving thin-film transistor M1 may include: a driving active layer 10 on the substrate 01, a driving gate 20 on a side, distal from the substrate 01, of the driving active layer 10, a gate insulating layer 30 on a side, distal from the substrate 01, of the driving gate 20, an interlayer dielectric layer 40 on a side, distal from the substrate 01, of the gate insulating layer 30, and a driving source 50 and a driving drain 60 on a side, distal from the substrate 01, of the interlayer dielectric layer 40. The driving source 50 and the driving drain 60 are disposed on different layers, and the gate insulating layer 30 may include a first gate insulating layer 301 and a second gate insulating layer 302 as shown in FIG. 14.

The gate metal layer G according to the aforesaid embodiments may be the metal layer corresponding to the driving gate 20 shown in FIG. 14. The source-drain metal layer SD according to the aforesaid embodiments may be the metal layer corresponding to the driving source 50 and the driving drain 60 shown in FIG. 14. For example, the expression that the connecting portion B1 and the gate metal layer G are disposed on the same layer may indicate that the connecting portion B1 and the driving gate 20 are disposed on the same layer.

It should be noted that, in embodiments of the present disclosure, the expression that a plurality of structures is disposed on the same layer indicates that the plurality of structures may be formed during the manufacturing process from the same material layer by the patterning process, thereby simplifying the manufacturing process of the display substrate. For example, the connecting portion B1 and the driving gate 20 may be formed by performing the patterning process on the same conductive layer. Optionally, the material of the conductive layer may include metal materials such as aluminum, molybdenum, titanium, or an alloy material, and may also include an indium tin oxide (ITO) or other metal oxides. The material of each functional layer is not limited in embodiments of the present disclosure.

Optionally, the storage capacitor C1 may include a first capacitive electrode C10 and a second capacitive electrode C20. The first capacitive electrode C10 and the driving gate 20 may be disposed on the same layer, and the second capacitive electrode C20 may be disposed between the gate insulating layer 30 (e.g., the second gate insulating layer 302 shown in FIG. 14) and the interlayer dielectric layer 40.

Optionally, the light-emitting diode L1 may include: a first electrode L11, a light-emitting layer L12 and a second electrode L13 arranged sequentially along the direction going away from the substrate 01, and the light-emitting layer L12 may emit light when a voltage is applied between the first electrode L11 and the second electrode L13. The first electrode L11 of the light-emitting diode L1 may be electrically connected to the driving drain 60 of the driving thin-film transistor M1, such that the driving thin-film transistor M1 may control the light-emitting state of the light-emitting diode L1.

Optionally, further referring to FIG. 14, in some embodiments, the sub-pixel P1 may further include functional structures such as a buffer layer 70 on a side of the base substrate 01, a flattening layer 80 covering the driving source 50 and the driving drain 60, a pixel defining layer 90 for defining a plurality of sub-pixels P1, a support layer 100, and a package layer 200. For example, the pixel defining layer 90 may include a plurality of openings corresponding to the plurality of sub-pixels P1, respectively, and the light-emitting diodes L1 may be formed in the plurality of openings, respectively.

Optionally, the package layer 200 may include a plurality of package sub-layers, and the sub-pixel P1 shown in FIG. 14 may for example totally include three package sub-layers. For example, the three package sub-layers include a first inorganic package sub-layer, an organic package sub-layer, and a second inorganic package sub-layer that are arranged in a laminated fashion, such that the encapsulation effect of the package layer 200 can be enhanced.

Optionally, the gate insulating layer 30 (including the first gate insulating layer 301 and the second gate insulating layer 302), the interlayer dielectric layer 40, the buffer layer 70, the flattening layer 80, the pixel defining layer 90, the support layer 100, and the package layer 200 may all be formed by the insulating material, and may, according to needs, be formed by organic insulating materials such as a polyimide or resin material, or inorganic insulating materials such as silicon oxide, silicon nitride, or silicon oxynitride. The material of each functional layer is not specifically limited in embodiments of the present disclosure.

In summary, embodiments of the present disclosure provide a display substrate, and in the display substrate, at least one data-select circuit group may control a data line lead to transmit a data signal to at least two data lines by time division in response to switch control signals supplied by at least two switch control lines at different time periods. A plurality of connecting portions that is electrically connected to the first power bus and the plurality of power lines may extend along a region among the plurality of the data-select circuit groups. As a result, it is possible to increase the spacing between any two adjacent data-select circuit groups by flexibly adjusting positions of each data-select circuit group, which helps to widen the width of each connecting portion. Since the connecting portion is electrically connected to the power line that supplies the power signal to the sub-pixel, it is possible to reduce the impedance on the signal line supplying the power signal and thereby improve the display effect.

13

14

Figure 15:
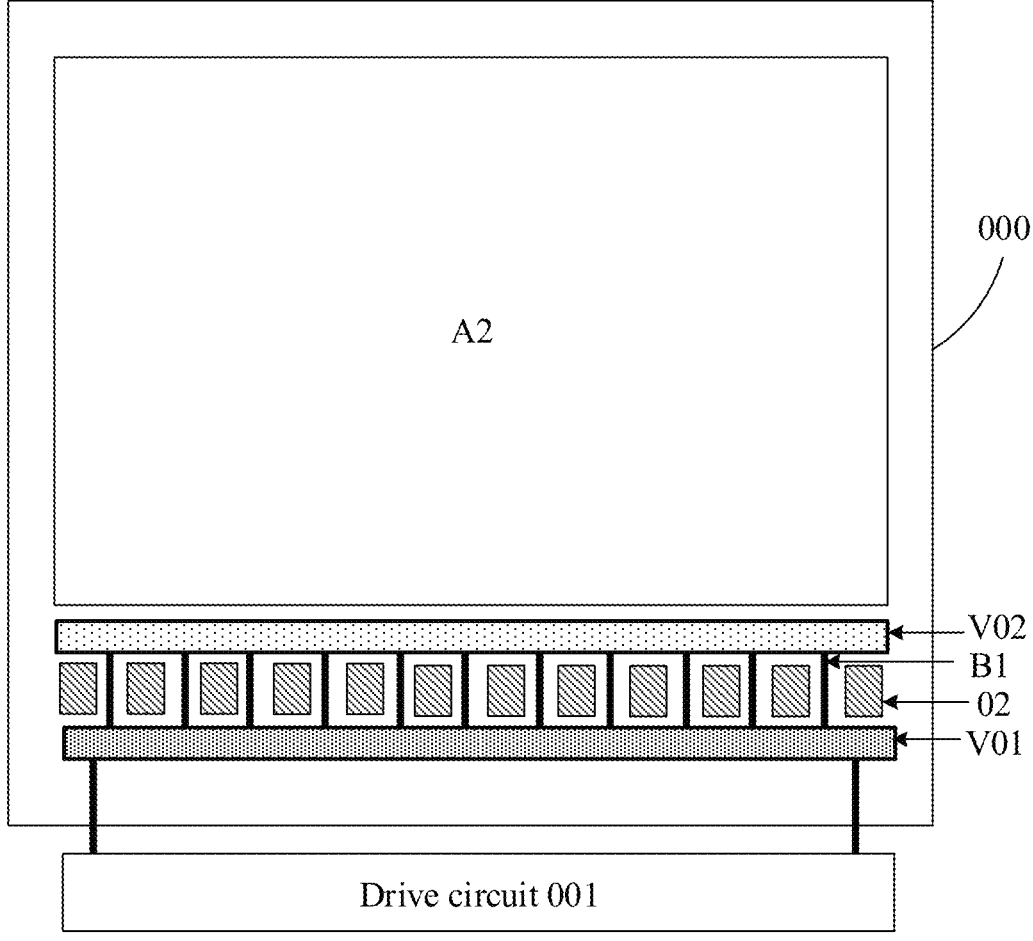
FIG. 15 is a schematic structural diagram of a display device according to an embodiment of the present disclosure.

FIG. 15 is a schematic structural diagram of a display device according to an embodiment of the present disclosure. As shown in FIG. 15, the display device may include the display substrate 000 as shown in any one of FIGS. 1 to 13.

In addition, the display device may further include a drive circuit 001, the drive circuit 001 may be electrically connected to various types of signal lines in the display substrate 000, and may be configured to supply the signal to the signal lines.

Figure 16:
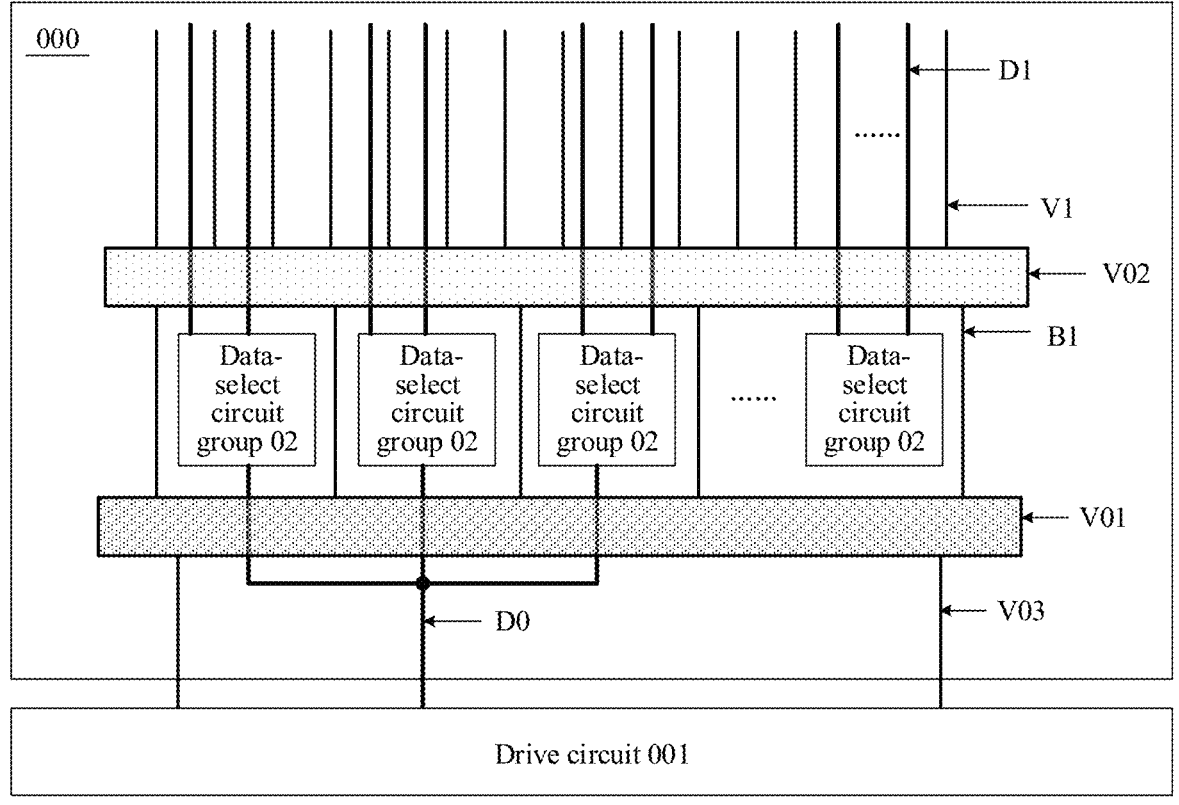
FIG. 16 is a schematic structural diagram of another display device according to an embodiment of the present disclosure.

For example, in combination with another display device shown in FIG. 16, the drive circuit 001 may include a direct-current power terminal and a data signal terminal. The data line lead D0 (i. drive, the first data line lead D01) may be electrically connected to the data signal terminal in the drive circuit 001, and the third power bus V03 may be electrically connected to the direct-current power terminal in the drive circuit 001. The drive circuit 001 may transmit the data signal to the data line lead D0 via the data signal terminal, and may transmit the power signal to the third power bus V03 via the direct-current power terminal.

In addition, the drive circuit 001 according to embodiments of the present disclosure may also be disposed on the base substrate 01 in the display substrate 000, and may be disposed in the non-display region A1, which facilitates the narrow bezel design.

It should be noted that FIG. 15 also identifies the first power bus V01, the connecting portion B1, the second power bus V02, the data-select circuit group 02, and the display region A2, and FIG. 16 also identifies the connecting portion B1, the second power bus V02, the third power bus V03, the data-select circuit group 02, the power line V1, and the data line D1.

Optionally, the display device according to embodiments of the present disclosure may be a rigid wearable display device. That is, the display substrate according to the aforesaid embodiments may be applied in a rigid wearable display device. Thus, the display yield of the rigid wearable display device can be ensured by supplying a stable direct-current power signal.

Of course, in some embodiments, the display device may be any product or component with a display function, such as an OLED display device, a piece of electronic paper, a mobile phone, a tablet computer, a TV set, a display, a notebook computer, and a navigator.

A person skilled in the art may clearly understand that for the specific operating process of the display substrate and display device described above, reference may be made to the corresponding process in the aforesaid method embodiments, and details are not described herein any further for the convenience and brevity of the description.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display substrate, comprising:
   a base substrate, provided with a display region and a non-display region that are arranged along a first direction;
   a plurality of sub-pixels in the display region;
   a plurality of data lines in the display region, electrically connected to the plurality of sub-pixels, and configured to supply a data signal to the plurality of sub-pixels;
   a plurality of power lines in the display region, electrically connected to the plurality of sub-pixels, and configured to supply a power signal to the plurality of sub-pixels;
   a plurality of data line leads in the non-display region and electrically connected to the plurality of data lines;
   a plurality of switch control lines in the non-display region;
   a plurality of data-select circuit groups in the non-display region and spaced apart along a second direction, wherein at least one of the plurality of data-select circuit groups is configured to, in response to switch control signals supplied by at least two of the plurality of switch control lines at different time periods, control one of the plurality of data line leads to transmit the data signal to at least two of the plurality of data lines by time division, and the second direction is intersected with the first direction;
   a first power bus in the non-display region and on a side, distal from the display region, of the plurality of data-select circuit groups; and
   a plurality of connecting portions, electrically connected to the first power bus and the plurality of power lines respectively, wherein the plurality of connecting portions extend along a region among the plurality of data-select circuit groups, the plurality of connecting portions are arranged alternately with the plurality of data-select circuit groups, and a same number of connecting portions are between two adjacent data-select circuit groups.

2. The display substrate according to claim 1, further comprising:
   a second power bus between the display region and the plurality of data-select circuit groups, and electrically connected to the plurality of connecting portions and the plurality of power lines;
   wherein the second power bus and the connecting portion are on a same layer, the second power bus and the first power bus are on different layers, and the second power bus and the power line are on different layers.

3. The display substrate according to claim 2, wherein the first power bus is electrically connected to the connecting portion via a via hole, and the power line is electrically connected to the second power bus via a via hole.

4. The display substrate according to claim 1, further comprising:
   a third power bus on a side, distal from the display region, of the first power bus, and electrically connected to the first power bus;
   wherein the third power bus is provided with at least one through hole and is configured to be in contact with a package material.

5. The display substrate according to claim 1, wherein one of the connecting portions is between each two adjacent data-select circuit groups.

6. The display substrate according to claim 1, wherein at least two of the data-select circuit groups are electrically connected to a same data line lead.

7. The display substrate according to claim 1, wherein each three adjacent data-select circuit groups are electrically connected to a same data line lead.

8. The display substrate according to claim 7, further comprising:
   six switch control lines, extending along the second direction, and electrically connected to three adjacent data-select circuit groups that share a same data line lead.

9. The display substrate according to claim 8, wherein each of the data-select circuit groups comprises two gates, one source and two drains;

wherein the two gates are electrically connected to two of the switch control lines, the two drains are electrically connected to two of the data lines, and the one source is electrically connected to one of the data line leads.

10. The display substrate according to claim 1, wherein the plurality of data line leads comprise: a first data line lead and a second data line lead;

wherein the first data line lead is electrically connected to the second data line lead, the second data line lead is electrically connected to the data line, and the second data line lead and the first data line lead are on different layers.

11. The display substrate according to claim 10, wherein the first data line lead is overlapped with the first power bus and the switch control line, and the second data line lead is overlapped with two of the connecting portions.

12. The display substrate according to claim 10, wherein the plurality of data line leads further comprise a third data line lead;

wherein the third data line lead is electrically connected to the data line and the data-select circuit group.

13. The display substrate according to claim 12, wherein the third data line lead is overlapped with the second power bus in the display substrate.

14. The display substrate according to claim 13, wherein in the display substrate, the first data line lead and the switch control line and are on different layers, the first data line lead and the first power bus are on different layers, the second data line lead and the connecting portion are on different layers, and the third data line lead and the second power bus are on different layers.

15. The display substrate according to claim 1, wherein the first power bus, the switch control line, the data line, the power line, and a second data line lead and a third data line lead in the plurality of data line leads are all on a same layer as a first metal layer of the display substrate; and the first data line lead in the plurality of data line leads, the connecting portion, and a second power bus and a third power bus in the display substrate are all on a same layer as a second metal layer of the display substrate.

16. The display substrate according to claim 15, wherein the first metal layer is a source-drain metal layer in the display substrate, and the second metal layer is a gate metal layer in the display substrate.

17. The display substrate according to claim 1, further comprising: at least one electrostatic discharge circuit;

wherein each of the at least one electrostatic discharge circuit is electrically connected to a first drive signal line, a second drive signal line, and one data line lead.

18. The display substrate according to claim 17, wherein each of the at least one electrostatic discharge circuit is between two adjacent connecting portions; and the first drive signal line, the electrostatic discharge circuit and the second drive signal line are between the first power bus and the switch control line, and are sequentially arranged along the first direction.

19. A display device, comprising a display substrate, wherein the display substrate comprises:

a base substrate, provided with a display region and a non-display region that are arranged along a first direction;

a plurality of sub-pixels in the display region;

a plurality of data lines in the display region, electrically connected to the plurality of sub-pixels, and configured to supply a data signal to the plurality of sub-pixels;

a plurality of power lines in the display region, electrically connected to the plurality of sub-pixels, and configured to supply a power signal to the plurality of sub-pixels;

a plurality of data line leads in the non-display region and electrically connected to the plurality of data lines;

a plurality of switch control lines in the non-display region;

a plurality of data-select circuit groups in the non-display region and spaced apart along a second direction, wherein at least one of the plurality of data-select circuit groups is configured to, in response to switch control signals supplied by at least two of the plurality of switch control lines at different time periods, control one of the plurality of data line leads to transmit the data signal to at least two of the plurality of data lines by time division, and the second direction is intersected with the first direction;

a first power bus in the non-display region and on a side, distal from the display region, of the plurality of data-select circuit groups; and a plurality of connecting portions, electrically connected to the first power bus and the plurality of power lines respectively, wherein the plurality of connecting portions extend along a region among the plurality of data-select circuit groups, the plurality of connecting portions are arranged alternately with the plurality of data-select circuit groups, and a same number of connecting portions are between two adjacent data-select circuit groups.

* * * * *